(12) United States Patent
Brandenburg et al.

(10) Patent No.: US 7,447,041 B2
(45) Date of Patent: Nov. 4, 2008

(54) COMPRESSION CONNECTION FOR VERTICAL IC PACKAGES

(75) Inventors: Scott D. Brandenburg, Kokomo, IN (US); Thomas A. Degenkolb, Noblesville, IN (US); Shing Yeh, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/712,718

(22) Filed: Mar. 1, 2007

(65) Prior Publication Data

US 2008/0212296 A1 Sep. 4, 2008

(51) Int. Cl.
   *H05K 7/00* (2006.01)
(52) U.S. Cl. .............. 361/760; 361/688; 361/704; 361/807; 257/341; 257/692; 257/778
(58) Field of Classification Search ............... 361/760, 361/688, 704, 807; 257/341, 578, 666–668, 257/678, 688–692, 706, 778
See application file for complete search history.

(56) References Cited

U.S. PATENT DOCUMENTS

| | | | | |
|---|---|---|---|---|
| 4,607,276 A * | 8/1986 | Butt | .............. | 257/674 |
| 5,140,406 A * | 8/1992 | Matsuda et al. | .............. | 257/730 |
| 5,345,107 A * | 9/1994 | Daikoku et al. | .............. | 257/717 |
| 5,360,985 A * | 11/1994 | Hiyoshi et al. | .............. | 257/181 |
| 5,420,461 A * | 5/1995 | Mallik et al. | .............. | 257/734 |
| 6,373,129 B1 * | 4/2002 | Yamazaki et al. | .............. | 257/688 |
| 6,388,458 B1 * | 5/2002 | Hembree et al. | .............. | 324/755 |
| 6,545,879 B1 * | 4/2003 | Goodwin | .............. | 361/807 |
| 7,042,080 B2 * | 5/2006 | Kirby et al. | .............. | 257/692 |
| 2001/0029063 A1 * | 10/2001 | Fukuda | .............. | 438/111 |
| 2002/0056922 A1 * | 5/2002 | Funaya et al. | .............. | 257/778 |
| 2003/0011051 A1 * | 1/2003 | Woodworth et al. | .............. | 257/666 |
| 2003/0067071 A1 * | 4/2003 | Cardwell | .............. | 257/706 |
| 2004/0094828 A1 * | 5/2004 | Campbell et al. | .............. | 257/666 |
| 2005/0048807 A1 * | 3/2005 | Li | .............. | 439/66 |
| 2005/0186707 A1 * | 8/2005 | Standing et al. | .............. | 438/110 |
| 2005/0225313 A1 * | 10/2005 | Kazama et al. | .............. | 324/158.1 |
| 2006/0151868 A1 * | 7/2006 | Zhu et al. | .............. | 257/690 |
| 2006/0189032 A1 * | 8/2006 | Murphy | .............. | 438/109 |
| 2006/0220123 A1 * | 10/2006 | Standing et al. | .............. | 257/341 |
| 2007/0090496 A1 * | 4/2007 | Otremba | .............. | 257/666 |
| 2007/0099343 A1 * | 5/2007 | Pavier | .............. | 438/106 |
| 2007/0108585 A1 * | 5/2007 | Pavier et al. | .............. | 257/690 |
| 2007/0181908 A1 * | 8/2007 | Otremba | .............. | 257/107 |
| 2007/0215980 A1 * | 9/2007 | Otremba | .............. | 257/578 |
| 2007/0215996 A1 * | 9/2007 | Otremba | .............. | 257/678 |

* cited by examiner

*Primary Examiner*—Dean A. Reichard
*Assistant Examiner*—Xiaoliang Chen
(74) *Attorney, Agent, or Firm*—Jimmy L. Funke

(57) ABSTRACT

An improved vertical integrated circuit device package that eliminates or reduces the need for wire bond connections and/or solder connections is provided. The package includes a vertical device having electrodes on opposite surfaces, and a compressed spring member that is used to establish compression electrical connections between the electrodes and corresponding electrically conductive elements.

7 Claims, 1 Drawing Sheet

COMPRESSION CONNECTION FOR
VERTICAL IC PACKAGES

TECHNICAL FIELD

The invention relates to integrated circuits (IC) packages, and more particularly to electrical connections for high current vertical device IC packages.

BACKGROUND OF THE INVENTION

Various types of circuit board components have been specifically developed for high current and high power applications, such as hybrid and electric vehicles. Such components often comprise a semiconductor device, such as a diode, thyristor, metal oxide semiconductor field effect transistor (MOSFET), isolated gate bipolar transistor (IGBT), resistors, etc., depending on the particular circuit and use desired. Vertical devices are typically formed in a semiconductor (e.g., silicon) die having metalized electrodes on its opposite surfaces, e.g., a MOSFET or IGBT with a drain/collector electrode on one surface and gate and source/emitter electrodes on its opposite surface. The die is mounted on a conductive pad for electrical contact with the drain/collector electrode, with connections to the remaining electrodes on the opposite surface often being made by wire bonding. The pad and wires are electrically connected to a lead frame having leads projecting outside a protective housing that is often formed by overmolding the lead frame and die.

Components of the type described above include well-known industry standard packages, such as the TO 220 and TO 247 packages, which are pre-packaged integrated circuit components having leads adapted for attachment (e.g., by soldering) to a printed circuit board (PCB). The overmolded housings of these packages protect the die, wire bonds, etc., while typically leaving the lower surfaces of the conductive pad exposed to provide a thermal and/or electrical path out of the package. Such a path allows the package to be connected to an electrical bus for electric connection to the PCB, or a heat-sinking mass for dissipation of heat from the package.

The conventional high power and high current vertical device IC packaging concepts have electrical connection methods that utilize either a wire bond approach or a complicated package with dual solder joints. These solder joints have a reduced life due to high stresses created from the mismatch between the coefficient of thermal expansion of the substrate and the coefficient of thermal expansion of the rather large integrated circuit. This mismatch becomes an even greater problem with the use of a copper slug to mount the IC device. Accordingly, improved connection technology that does not use a wire bond approach or solder joints is desired.

SUMMARY OF THE INVENTION

The invention involves the use of a compression electrical connection for vertical IC devices.

In accordance with a first aspect of the invention, springs (e.g., elastomers or metal leaf or coil springs) under compression provide a clamping force to ensure electrical contact of an integrated circuit device to a printed circuit board.

In accordance with another aspect of the invention, a thermoset overmold process is used to provide a force to form the compression electrical connections.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED
EMBODIMENTS

Figure 1:
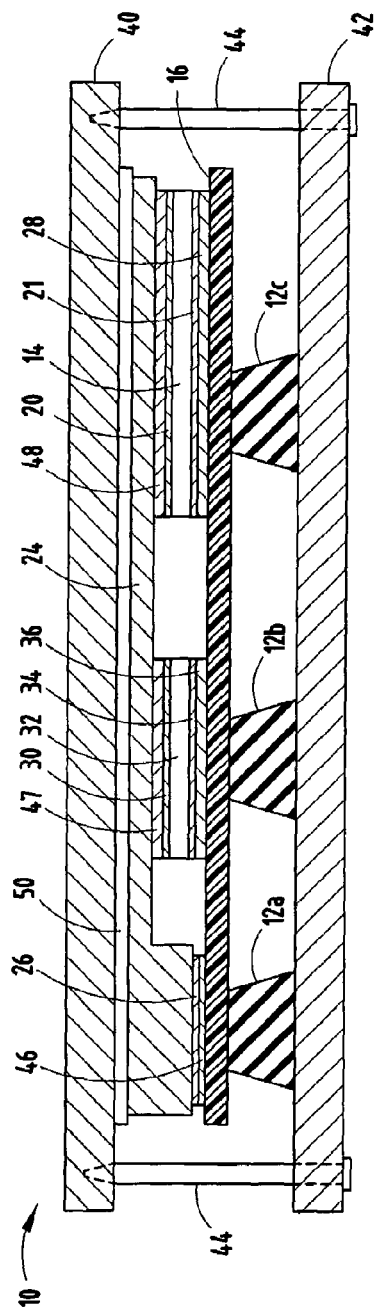
FIG. 1 is a cross-sectional view of an integrated circuit package utilizing elastomeric springs under compression for effecting electrical connections.

Shown in FIG. 1 is a vertical device integrated circuit package 10 utilizing springs 12a, 12b and 12c that are under compression to provide a claming force to ensure electrical contact of an integrated circuit device 14 (e.g., an IGBT) with a printed circuit board 16. Integrated circuit device 14 is a vertical device, more particularly, an IGBT, having metalized electrodes (electrical contacts) 20, 21 on opposite surfaces. An electrically conductive element 24 (e.g., copper strap) electrically connects electrical contact 20 of IGBT with an electrical contact 26 on printed circuit board 16, while the electrical contact 21 on the opposite side of IGBT 14 is electrically connected to a separate electrical contact 28 on printed circuit board 16. In the illustrated embodiment, a diode 32 is included in package 10. Diode 32 includes an electrical contact 30 electrically connected to conductive element 24 and a second electrical contact 34 on a surface opposite the surface on which electrical contact 30 is located, which is electrically connected to a contact pad 36 on printed circuit board 16.

The entire assembly, including elastomeric springs 12a, 12b and 12c is sandwiched between a heat sink 40 and a cover member 42. Fasteners 44 (e.g., screws) are used for holding the assembly together under compression. In particular, sufficient compression is applied to compress resiliently deformable spring members 12a, 12b, and 12c so that they urge electrical contacts together to establish compression electrical connections between corresponding electrical contacts.

As shown in FIG. 1, the springs are preferably located directly under the interfacing electrical contacts. That is, the compressive forces from springs 12a, 12b and 12c have a vector orthogonal to and passing through the interfacing contacts of the compression electrical connections.

In order to minimize oxidation, corrosion and/or electrical resistivity at the compression electrical connections, it is desirable that the contacts 20, 21, 30, 34, 28, 36 and 46 are gold-plated. Similarly, it is desirable that gold-plating be provided on electrically conductive element 24 as indicated by reference numerals 26, 47 and 48.

A thermal interface material 50 may be disposed between electrically conductive element 24 and heat sink 40 to enhance heat transfer through conductive element 24 and into heat sink 40, where heat can be efficiently transferred to the surrounding atmosphere. The thermal interface material may also provide dielectric isolation.

Springs 12a, 12b and 12c may comprise an elastomeric material, or a metal spring (e.g., a coil spring or leaf spring).

Figure 2:
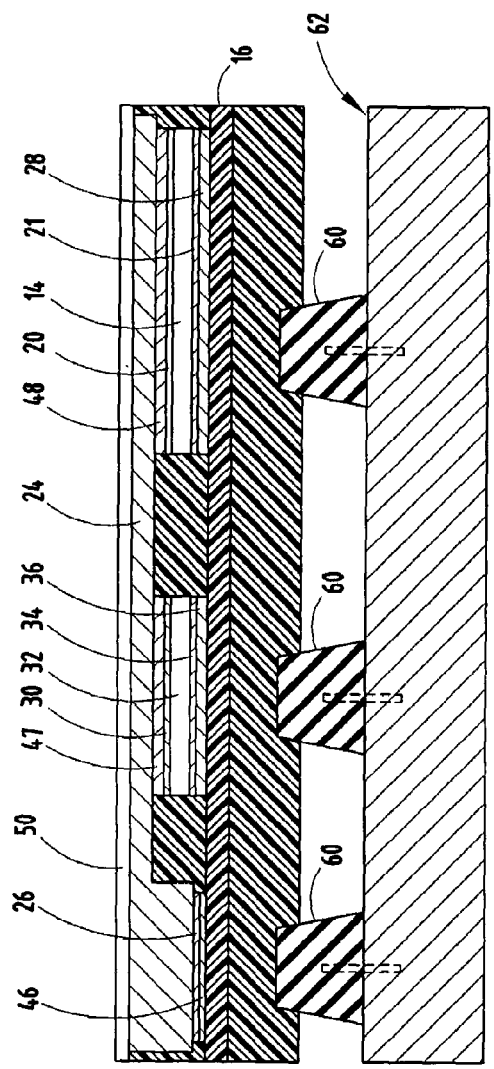
FIG. 2 is a cross-sectional view of an integrated circuit package utilizing a thermoset overmold process to provide a force to establish compression electrical connections.

In accordance with another aspect of the invention, as shown in FIG. 2, compression spring members can be formed in situ during an overmolding process. This can be achieved using spring pressure pins 60 (which are part of molding tool 62) to temporarily hold the assembly together during an overmolding process. Springs 60 provide a specific force so that the molding composition (e.g., a thermoset epoxy resin) does not flow into gaps between the integrated circuit and the printed circuit board or between the integrated circuit board and the electrically conductive element. During the molding process, pins 60 are retracted and the molding composition fills the volume vacated by retraction of pins 60. In an alternative secondary process the pins may provide forces during the entire molding process, and be retracted when the mold cavity is opened. The holes formed by the pins can then be filled with epoxy after the molding process. The volume vacated by retraction of pins 60. The molding composition adhesively bonds the printed circuit board, heat sink, and electrically conductive strip together. The maximum use temperature is always below the zero-stress state (165° C. molding temperature). This coupled with use of a material having a low coefficient of thermal expansion keeps the structure in compression. Mold locking features can also be employed in the heat sink, printed circuit board and other components of the package to mechanically lock the structure together.

Advantages of the invention include simplified manufacturing, high current connection formed by gold-to-gold contact surfaces, no solder cracking to silicon integrated circuit connections, repairability (for FIG. 1 design only), and the absence of leads (i.e., solder-free package).

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An integrated circuit package comprising:
    an integrated circuit device having a first electrical contact on a first side of the integrated circuit device and a second electrical contact on an opposite second side of integrated circuit device;
    a printed circuit board having a first side and an opposite second side, a first electrical contact and a second electrical contact on the first side of the printed circuit board;
    an electrically conductive element electrically connecting the first electrical contact on the integrated circuit device with the first electrical contact on the printed circuit board;
    the second electrical contact on the integrated circuit device positioned immediately overlying the second electrical contact on the printed circuit board;
    a first spring member under compression urging the first electrical contact on the integrated circuit device against a first section of the electrically conductive element to establish a first compression electrical connection, and urging the second electrical contact on the integrated circuit device against the second electrical contact on the printed circuit board to establish a second compression electrical connection; and
    a second spring member under compression urging a second section of the electrically conductive element against the first electrical contact on the printed circuit board to establish a third compression electrical connection.

2. The package of claim 1, wherein the integrated circuit device is a MOSFET.

3. The package of claim 1, wherein the integrated circuit device is an IGBT.

4. The package of claim 1, further comprising a second circuit device having electrodes on opposite surfaces, and a third spring member under compression urging each of the electrodes in the second circuit device against a corresponding electrically conductive element to establish compression electrical connections between each of the electrodes of the second circuit device and the corresponding electrically conductive elements.

5. The package of claim 4, wherein the second circuit device is a diode.

6. The package of claim 1, wherein the spring members are comprised of an elastomeric material.

7. The package of claim 1, wherein the spring members are metal coil springs or metal leaf springs.

* * * * *